United States Patent [19]

Phillips et al.

[11] 4,406,985

[45] Sep. 27, 1983

[54] POWER CABLE FAULT FINDING APPARATUS AND METHOD

[75] Inventors: Alan C. Phillips, Los Altos; James L. Buxton, Menlo Park, both of Calif.

[73] Assignee: City of Seattle, The City Light Dep't., Seattle, Wash.

[21] Appl. No.: 201,188

[22] Filed: Oct. 27, 1980

[51] Int. Cl.³ .......................................... G01R 31/02
[52] U.S. Cl. ..................... 324/51; 324/133; 361/93
[58] Field of Search ................ 324/51, 133, 102; 340/664; 361/93; 336/175

[56] References Cited

U.S. PATENT DOCUMENTS

| | | | |
|---|---|---|---|
| 3,304,490 | 2/1967 | Dubin et al. | 340/664 X |
| 3,512,045 | 5/1970 | Tipton et al. | 336/175 X |
| 3,573,556 | 4/1971 | Zocholl | 340/664 X |
| 3,735,248 | 5/1973 | Reese | 340/664 X |
| 3,777,217 | 12/1973 | Groce | 324/51 X |
| 3,991,366 | 11/1976 | Schweitzer, Jr. | 361/93 X |

Primary Examiner—Stanley T. Krawczewicz
Attorney, Agent, or Firm—Hughes, Barnard & Cassidy

[57] ABSTRACT

An inductance coil is clamped onto the cable which is to be monitored. For normal line currents, the coil produces a signal voltage which charges a reset capacitor which in turn periodically discharges to an indicator to show a no fault condition. When the line current goes above a predetermined fault level and remains at that level for a corresponding fault time period, the coil develops a signal voltage sufficiently high to charge a "set" capacitor that discharges to the indicator to show a fault condition. The indicator continues to show the fault condition until normal current has returned to cause the "reset" circuit to operate to indicate no fault. To insure that the set capacitor discharges in a manner to indicate reliably the fault condition, there is provided a voltage responsive variable impedence in the circuitry to charge the set capacitor. This variable impedence matches the fuse characteristic in the main power line.

38 Claims, 6 Drawing Figures

POWER CABLE FAULT FINDING APPARATUS AND METHOD

BACKGROUND OF THE INVENTION

The present invention relates to an apparatus and method to detect in an electrical cable a fault condition caused by a current surge.

In a typical electrical power distribution system, a main power cable may run underground the better part of a mile and feed as many as ten step-down transformers. If a fault occurs in the line or in one of the transformers, there is commonly current surge which operates a fuse at the origin of the line to cut off current through the line. The service problem is to find the location of the fault and repair it quickly and inexpensively so that the line may be returned to service.

It has been proposed in the prior art to have fault detectors at various locations in a power distribution system. Thus, the service crew will be able to check the various fault detectors to determine the location of the fault. However, to the best knowledge of the applicants herein, these prior art fault detecting devices have been unreliable. More often than is acceptable, they have given no fault indication when they should have, or have given a false indication when a fault current had not passed by them.

In addition to reliability there are other factors to be considered in designing a fault detecting system. For example, it would be desirable that it be entirely passive to that it would derive all of its operating power from the current in the line that it is monitoring. One way of accomplishing this is to have the recognizer in the detecting equipment respond to the fields associated with the current in the line. However, with a fault recognizer that flags all currents above a fixed threshold, there could be a false indication where there is simply inductive kick-back, or no detection for a fault which resulted from a marginal over current which existed for a relatively long duration. Also, it has been proposed in the prior art to provide a fault detector which has the fault detecting signal charge a capacitor, which in turn discharges to show a fault condition. This too has proven unreliable in that if the device is set to detect faults of a certain current magnitude, it will not reliably detect faults which result from current surges of a substantially different magnitude.

A search of the patent literature has disclosed a number of United States Patents. These are as follows.

U.S. Pat. No. 1,830,541, Harris, and U.S. Pat. No. 2,815,493, Kain, both disclose current transformers to measure current.

U.S. Pat. No. 3,777,217, Groce et al., discloses a system in which a current transformer generates a current to charge a first capacitor which in turn discharges to indicate normal current. A second capacitor is charged and fired to show when a current reaches a higher level. Another device which operates on generally this same principle is indicated in U.S. Pat. No. 3,512,045, Tipton et al.

U.S. Pat. No. 3,991,366, Schweitzer, Jr., shows a fault detector that employs a reed switch that is closed when a certain level of current is reached.

In view of the foregoing, it is an object of the present invention to provide a fault detecting apparatus and method which is able to reliably recognize substantially all faults, both fast and slow, which is able to be attached to a power distribution system without negative impact on its operation, which is able to operate for years without maintenance, and which is relatively small, inexpensive and easy to install.

SUMMARY OF THE INVENTION

The fault detecting apparatus of the present invention is adapted to detect in an electric cable a fault causing current surge at a fault level which is dependent upon both magnitude and duration of current surge, and to be reliably responsive to a fault condition and nonresponsive to a no-fault condition. The apparatus is further adapted to be responsive to conditions where the current surge is characterized in that for each fault current level above a minimum fault level, there is a corresponding fault time period within which a fault will occur, and magnitude of the fault current has an inverse functional relationship with magnitude of fault time period, in that for a given increase in magnitude of fault current level, there is a decrease in fault time period.

In general, the apparatus comprises a current sensing means adapted to be responsive to a current being monitored to produce a first signal which varies as a function of magnitude of the current being monitored. There is a circuit operatively connected to said current sensing means to be responsive to said first signal to produce a second signal having a value which has an inverse functional relationship to the fault time period corresponding to the magnitude of the current being monitored. There is integrating means to integrate said second signal as a function of time to produce a fault signal where an integrated value produced by said integrating means is above a predetermined value. Indicating means is operatively connected to the integrating means to indicate a fault condition in response to a fault signal. In the preferred form, the integrating means comprises capacitor means.

In the embodiment shown herein, the first signal has a first value that has a direct proportional relationship to magnitude of the current being monitored. The second signal has a second value that has a direct proportional relationship to a third value equal to the first value divided by a fourth value corresponding to the magnitude of the current being monitored multiplied by the fault time period corresponding to the magnitude of the current being monitored.

There is circuit means operatively connected to the capacitor means and responsive to the indicating signal to transmit a charging current to the capacitor. The charging current has a magnitude which has a direct functional relationship to magnitude of the current being monitored and an inverse functional relationship with respect to rate of change of fault current level relative to an absolute value of rate of change of fault time period.

In the preferred form, the apparatus further comprises variable impedance means operatively connected to the current sensing means and the integrating means. The variable impedance means is responsive to the first signal to have impedance thereof varying as a function of magnitude of the first signal.

The current sensing means desirably comprises inductance coil means adapted to be positioned in proximity to the current being monitored, with voltage induced in the inductance coil means being the first signal. The magnitude of this first signal voltage is completely determined by the impedance between the terminals on the inductance coil. The first signal has a generally proportional relationship with the current surges in the current being monitored, in that increases of current surges causes corresponding increases in the first signal. The variable impedance is responsive to the indicating signal to have its impedance varying as a function of the magnitude of current being monitored with respect to corresponding changes in the fault time period.

In the particular embodiment shown herein, for a change of the fault current level, there is a relatively greater change of the corresponding fault time period. Thus, the variable impedance means has the impedance thereof decrease as a function of increases of fault current level.

In the preferred form, the circuit means comprises a first shunting circuit portion connected to the inductance coil in a manner to provide a shunting current path bypassing the capacitor means. The circuit also has a second charging circuit portion connected in series between the inductance coil means and the capacitor means in a manner to transmit the charging current to the capacitor means. The second charging circuit portion incorporates the variable impedance means in a manner that the variable impedance means is responsive to the first signal so that the impedance thereof decreases as a function of increase of the first signal.

The variable impedance means comprises a plurality of resistors and diodes connected in parallel with one another between the capacitor means and the inductance coil. At least one of the resistors has a higher resistance level and is connected in series with first diode means having a lower transmitting voltage difference value. There is at least one other resistor having a lower resistance value and being connected in series with second diode means having a higher voltage difference transmitting value.

Desirably, the variable impedance means comprises a plurality of diodes connected in series with one another between the capacitor means and inductance coil means. Thus, one of the resistors having a lower resistance value is connected in series with all of the diodes, while another resistor having a higher resistance value is connected in parallel with at least one of the diodes and in series with at least one other of the diodes. In the preferred form, there are at least three diodes connected in series with one another and three resistors connected in parallel with one another. One of the resistors of relatively low resistance value is connected in series with all three diodes. A second resistor of intermediate resistance value is connected in series with two of the diodes. A third resistor of higher resistance value is connected in series with only one of the diodes.

Desirably, there is rectifying means operatively connected between the coil and the capacitor. In the preferred form, this is a bridge rectifier connected in series between the capacitor and one terminal of the coil.

In a specific configuration of the impedance means there is at least one transistor connected in parallel with the several resistors. The transistor has a main current carrying electrode connected to a zener diode having a breakdown voltage higher than the voltage difference transmitting value of the three diodes of the variable impedance means. Thus, the transistor becomes conductive at indicating signal voltages higher than those at which the three diodes will become conductive.

In the preferred embodiment of the overall apparatus of the present invention, the apparatus comprises five components, namely:

a. a pickup coil adapted to be mounted proximate the current to be monitored,
b. an indicator having a no-fault position and a fault position
c. a reset circuit
d. a set circuit
e. a robber current circuit.

The reset circuit comprises first rectifying means operatively connected to the coil so as to draw a small portion of current from the coil. There is also a reset capacitor connected to the rectifying means so as to receive direct current therefrom and be charged to a predetermined discharge level. There is switch means operatively connected to the capacitor so as to become operative at the activating level of the reset capacitor. The switch means is connected to the indicator in a manner that operation of the first switch means causes the indicator to be in a no-fault position.

The set circuit comprises second rectifying means operatively connected to the coil so as to draw current therefrom. There is a set capacitor operatively connected to the rectifying means so as to be charged to a predetermined activating voltage. Second switch means is operatively connected to the second capacitor so as to become operative at the activating level of the set capacitor and operatively connected to the indicator so as to cause the indicator to be in a fault position.

The robber current circuit is operatively connected to the coil and to the capacitor. The robber current circuit comprises the aforementioned first shunting current portion and the second charging current portion. The specific features of the robber current circuit are described previously herein.

In the method of the present invention, there is produced a first signal having a value which varies as a function of magnitude of the current being monitored. Then a second signal is produced in response to the first signal, with the second signal having a value which has an inverse functional relationship to the fault time period corresponding to the magnitude of the current being monitored. More specifically, the value of the second signal varies as a logarithmic function of the magnitude of the current being monitored. The second signal is integrated as a function of time to produce a fault signal where an integrated value produced by integrating is above a predetermined value. The fault signal in turn activates an indicating means.

Other features of the present invention will become apparent from the following detailed description.

DESCRIPTION OF THE PREFERRED EMBODIMENT

The system of the present invention was designed to be used in conjunction with the electrical power distribution system of Seattle City Light of Seattle, Wash., U.S.A. Specifically, this was designed for use in the 26-kV lines in that power distribution system. Accordingly, the present invention will be described relative to the operating characteristics of that system.

Figure 1:
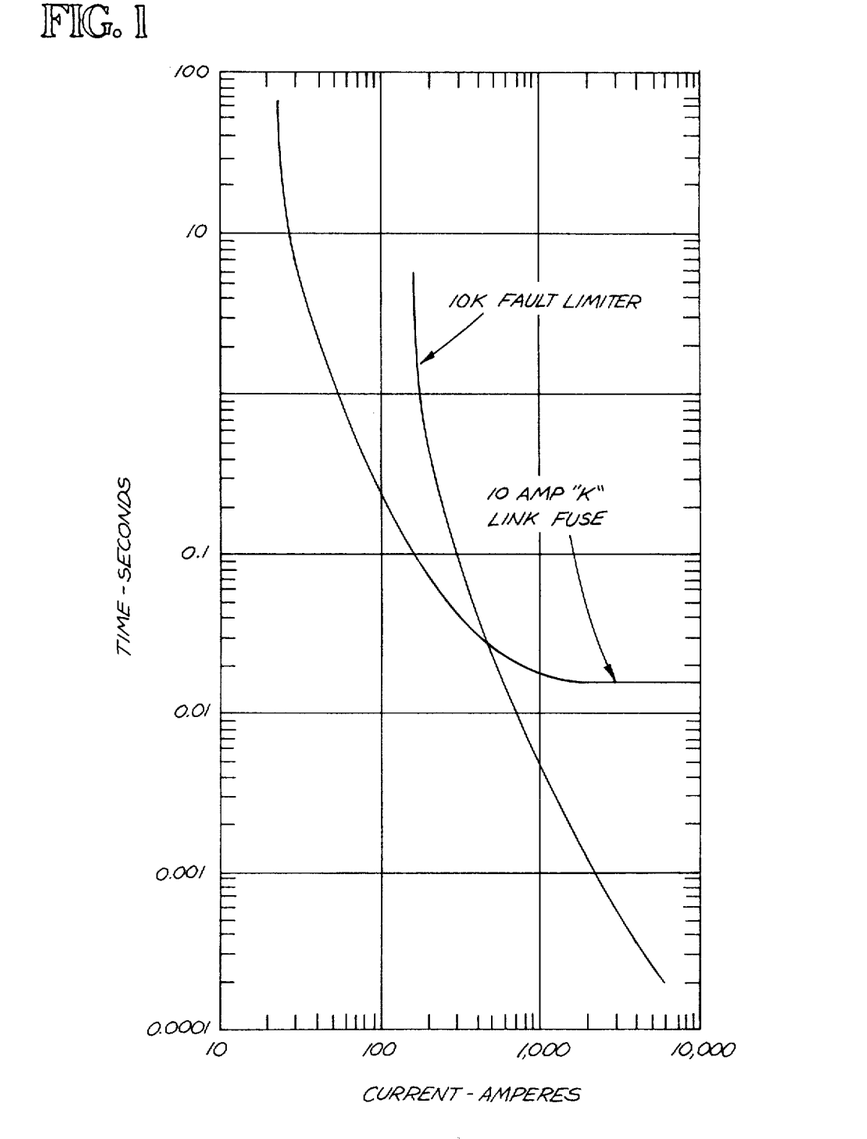
FIG. 1 is a graph illustrating the characteristics of fuses on a typical power distribution system.

The fault threshold on the 26 kV lines is derived from the operating characteristics of the fuses on that line. The lines are protected by a series combination of a 10K current limiting fuse and a 10K fault finder, and the operating characteristics of the fuse pair are shown in FIG. 1. It can be seen that for current surges above approximately 500 amperes, the 10K fault limiter would be the first to interrupt, while for current surges above the minimum fault level and below 500 amperes, the 10K current limiting fuse would be the first to interrupt.

Thus, by use of the graph of FIG. 1, for each current level above a predetermined minimum current fault level, there can be determined a corresponding "fault time period" within which either the fault limiter or the current limiting fuse would interrupt current to the line. For various current values from 50 to 5000 amperes, the corresponding fault time periods were determined from the plots on the graph of FIG. 1, and these are given in the table below:

| Current (amperes) | Time (seconds) |
| --- | --- |
| 5,000 | 0.0002 |
| 2,000 | 0.0014 |
| 1,000 | 0.005 |
| 500 | 0.014 |
| 300 | 0.042 |
| 100 | 0.230 |
| 50 | 1.0 |

An examination of the table immediately above indicates that for each rise in current above a predetermined minimum fault level, there is a corresponding decrease in the fault time period. However, it also becomes apparent that in terms of functional relationship the rate of decrease in the fault time period is substantially greater than the rate of increase in the fault current level. For example, if the fault current level is increased from 100 amperes to 1000 amperes (a tenfold increase), the fault time period decreases from 0.230 seconds to 0.005 seconds, which is approximately 1/46 of the fault time period for the 100 ampere level. From the foregoing, it becomes quite evident that the operating characteristics of the fuse system must be taken into account in designing a reliable fault indicating apparatus.

Figure 2A:
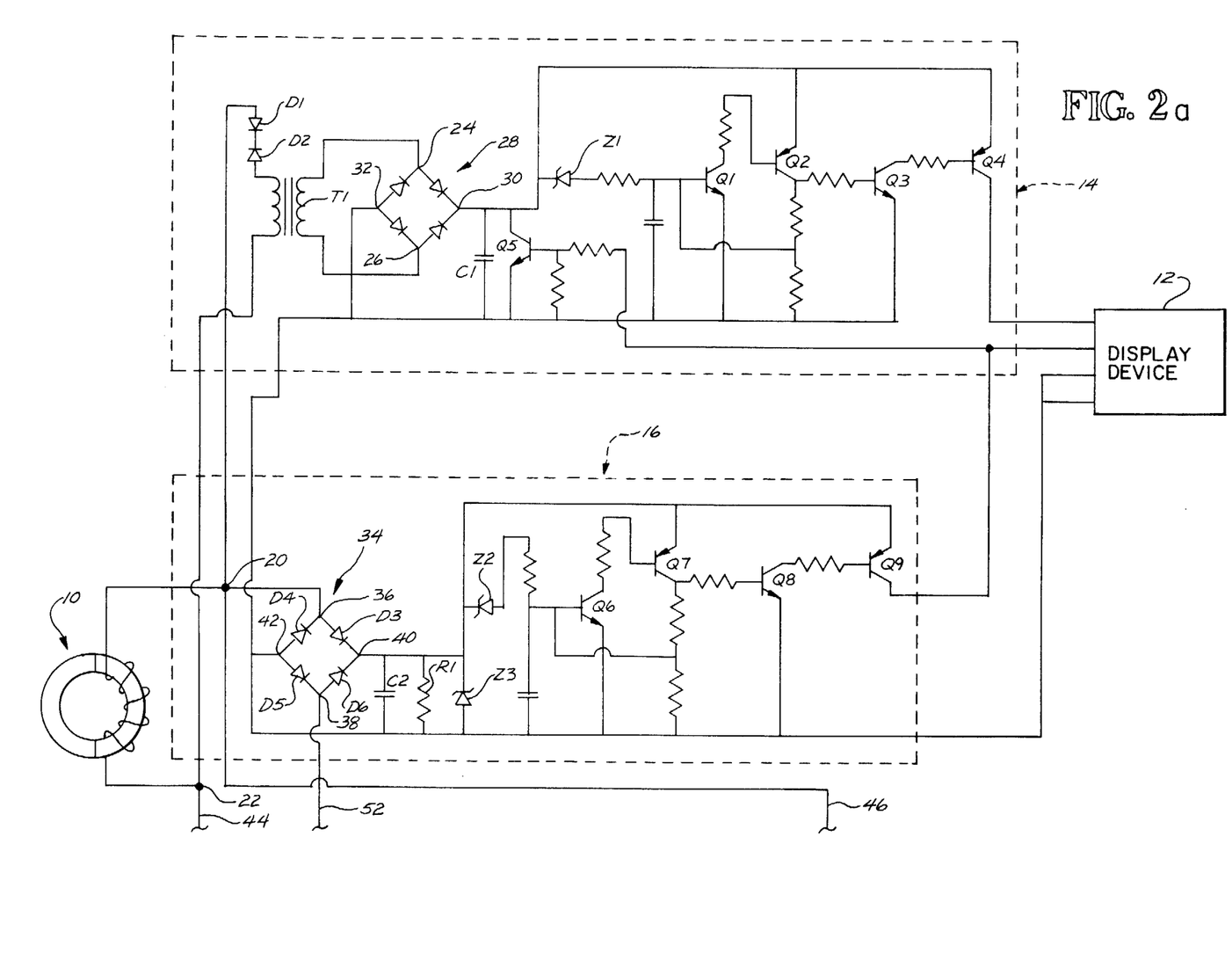
FIGS. 2a and 2b are circuit diagrams of the apparatus of the present invention.
Figure 2B:
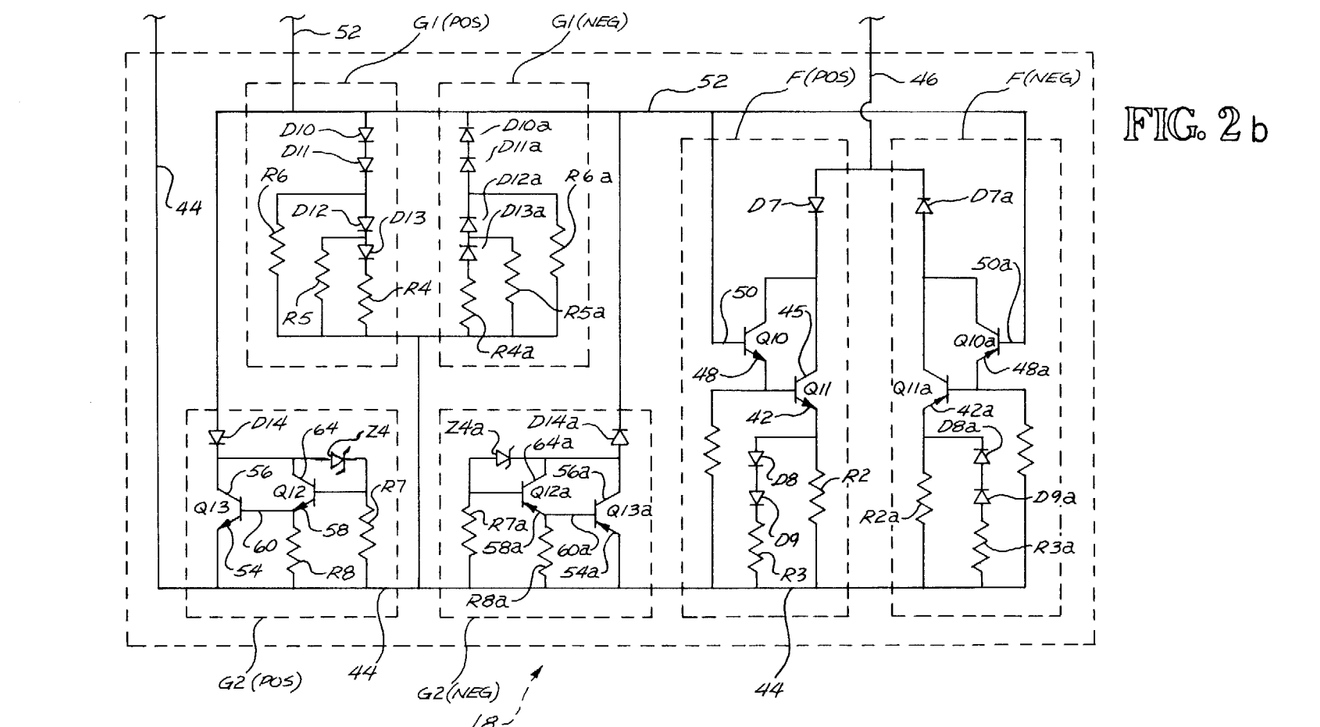

To describe the apparatus of the present invention, reference is now made to FIG. 2, which is a schematic diagram of the apparatus. There are five main components in the present invention, namely:

a. a pick-up coil 10,
b. a displaying device 12,
c. a display reset circuit 14
d. a display set circuit 16
e. a current robber circuit 18.

Each of these components will be discussed briefly, after which a detailed description of the present invention will be given.

The pick-up coil 10 is or may be of conventional design, and in the present embodiment is wound on a tape-wound steel split torroidal core. In this particular design, the number of turns on the core was set at 330. This coil 10 is clamped onto the line being monitored and thus lies in the magnetic field created by the line current. The function of this coil is to produce an indicating voltage which is generally proportional to the current in the main line.

The display device 12 is or may be of conventional design and in the present embodiment is one of the several magnetically latching displays which are presently commercially available. The display has two positions, one indicating a no-fault condition and the other indicating a fault condition.

The reset circuit 14 draws a small amount of current from the pick-up coil 10 to slowly charge a capacitor C1. When the line current being monitored is at normal current level, the capacitor C1 will charge up to a operating level about once every minute, and then discharge to transmit a reset signal to the display device 12. Thus, with the line current operating normally, about once every minute there is transmitted to the display device 12 a signal which indicates a no-fault condition. If the display device 10 already indicates a no-fault condition, then the periodic reset signal has no effect. However, if there has been a fault condition, and the fault condition has been corrected so that normal current is restored to the line, the reset signal will change the indication on the display device from the fault to the no-fault condition.

The display set circuit 16 functions to respond to a fault condition to send a set signal (i.e. a fault indicating signal) to the display device 12. This is accomplished by the set circuit 16 charging a capacitor C2 to a predetermined voltage level, after which the capacitor then discharges through a suitable switching device to cause the display device 12 to move to the fault indicating position.

The current robber circuit 18 is considered to be quite significant in the present invention and will be discussed in more detail later herein. However, it can be stated generally that the function of the current robber 18 is to cause the proper charging current to be transmitted to the set capacitor C2. This is done in a manner that the magnitude of the charging current has an inverse functional relationship (which specifically is a logarithmic relationship) to the fault time period corresponding to the magnitude of the line current that is being monitored.

In general, this is accomplished by proportioning the total available current from the pick-up coil 10 between two paths. For low fault current levels, most of the available current flows through a path shunting the reset capacitor C2, and only a relatively small current flows through a voltage responsive variable impedance path to charge the reset capacitor C2. However, for very high line currents, a larger percentage of the available current from the pick-up coil 10 travels through the variable impedance path to charge the reset capacitor C2 at a relatively rapid rate, thus causing this capacitor 22 to discharge in a relatively short time. In this manner, the current robber circuit 18 can cause the set circuit 16 to operate in such a manner that for any current level within the fault range, the set capacitor C2 will discharge shortly before the fuse system shuts off current to the line.

It can be generally stated that the current robber circuit is so arranged that the current to the capacitor C2 is approximately proportional to a value equal to the voltage produced by the coil 10, divided by a quantity corresponding to the magnitude of the current being monitored. As indicated previously, in the preferred embodiment this is a logarithmic relationship.

To proceed now to a more detailed description of the present invention, the reset circuit 14 will now be described. The opposite ends of the pick-up coil 10 are connected to upper and lower junction terminals 20 and 22, respectively. The upper terminal 20 is connected in series through a pair of oppositely facing current limiting diodes D1 and D2 to the upper end of the primary winding of a transformer T1, while the lower terminal 22 is connected to the lower end of the primary winding of the transformer T1. With the diodes D1 and D2 being positioned oppositely to one another, on both negative and positive half cycles, the current through the primary winding of the transformer T1 is limited to the current limiting value of one or the other of the diodes. The opposite ends of the secondary winding of the transformer T1 are connected at 24 and 26, respectively, to opposite sides of a rectifying bridge 28. The positive output terminal 30 of the rectifying bridge 28 is connected to the positive side of the capacitor C1, while the negative output terminal 32 of the rectifying bridge 28 is connected to the negative side of the capacitor C1.

As the charge on the capacitor C1 continues to build up, it finally reaches an activating level (e.g. 12 volts) to cause the zener diode Z1 to become conductive. This in turn causes the transistor Q1 to be conductive, which in turn causes transistors Q2, Q3 and Q4 to conduct so that the charge on the capacitor C1 is transmitted to the display device 12. As indicated previously, if the display device 12 is already in a no-fault indicating position, this charge from the capacitor C2 will have no effect. However, if the display device 12 indicates a fault condition, this charge from the capacitor C1 will move the display device 12 to indicate a no-fault condition.

There is a fifth transistor Q5 connected across the capacitor C1. In the event that there is a fault condition, the set circuit 16 becomes operative to send a current pulse to the display device 12. This same pulse causes current to flow to the base electrode of the transistor Q5 to cuase it to be conductive so as to discharge the capacitor C1 across the transistor Q5. The reason for this isthat in the event there is a current surge which causes the set circuit 16 to operate to indicate a fault condition, there is a possibility that before the fault is cleared (i.e. one or both of the fuses intercupts the current), the line current will cause the capacitor C1 to discharge immediately after the capacitor C2 and reset the display indicator 12 back to the no-fault condition. However, the discharging of the capacitor C1 across the transistor Q5 will prevent this.

The set circuit 16 will now be described in more detail. Many of the components of the set circuit 16 are similar to (or identical to) corresponding components in the reset circuit 14. Accordingly, these similar components will be described only briefly herein. Thus, there is a rectifying bridge 34 having upper and lower input terminals 36 and 38, respectively, with a positive output terminal 40 and a negative output terminal 42. The positive and negative output terminals 40 and 42 are connected to opposite sides of the capacitor C2. The diodes of the rectifying bridge 34 are designated D3, D4, D5, and D6. The positive side of the capacitor C2 connects to a zener diode Z2, which in turn connects to the base electrode of a transistor Q6. There are three other transistors, Q7, Q8 and Q9 which are connected to the transistor Q6 in the same manner that the transistors Q2, Q3 and Q4 are connected to the transistor Q1. Thus, when the voltage across the capacitor C2 reaches a predetermined level (e.g. 12 volts) the zener diode Z2 becomomes conductive to cause the transistors Q6 through Q9 to be conductive and thus cause the charge from the capacitor C2 to be transmitted as a set pulse to the display device 12. As indicated previously, the set pulse from the capacitor C2 will cause the display device to move to a position to indicate a fault condition.

The upper terminal 36 of the bridge rectifier 34 is connected to the upper junction terminal 20 which in turn connects to one end of the pick-up coil 10. The opposite terminal 38 of the bridge rectifier 34 connects through the current robber circuit 18 to the lower junction terminal 22 which in turn is connected to the opposite end of the pick-up coil 10. There is a resistor R1 connected across the capacitor C2, and also a third zener diode Z3 also connected across the capacitor C2 in parallel with the resistor R1. In the case of a large fault, the zener diode Z3 prevents the capacitor C2 from charging to a destructive level by clamping the voltage at a set level.

The current robber circuit 18 will now be described with further reference to the second page of FIG. 2. The current robber circuit 18 can be considered as having two main sections, namely a bypass section F which shunts the rectifying bridge 34 and capacitor C2, and a charging section G which is connected in series between the bottom side of the pickup coil 10 and the lower input terminal 38 of the rectifying bridge 34.

The bypass section F has two parts, F(Pos) which conducts on positive half cycles from the coil 10, and F(Neg) which conducts on negative half cycles of the current from the coil 10. For purposes of description, the positive half cycle will be considered those cycles where the upper part of the coil 10 is positive, and the lower part is negative.

The positive section F(Pos) comprises a pair of transistors Q10 and Q11 which are connected in a darlington connection. The emitter electrode 42 of the transistor Q11 is connected to a resistor R2 to a line 44 which connects to the lower junction terminal 22, which in turn connects to the lower side of coil 10. The collector electrode 45 of transistor Q11 connects through a diode D7 to a main bypass line 46 which connects to the upper junction terminal 20, that in turn connect to the upper side of the coil 10. The emitter electrode 48 of the transistor Q10 supplies base current to the transistor Q11, while the base electrode 50 of the transistor Q10 connects to a line 52 which is in turn connected to the lower input terminal 38 of the rectifying bridge 34. Thus, base current can be supplied from the capacitor C2 discharging through the resistor R1 thence across the diode D5 to the line 52.

Connected in parallel with the resistor R2 is a second resistor R3 and a pair of diodes D8 and D9 in series with the resistor R3. The reason for this particular arrangement of providing two parallel paths to the emitter electrode 42 is mainly to provide the proper resistance levels at varying voltages imposed across the opposite ends of the coil 10. Thus, for very low voltages, there would be only one current path through R2. At higher voltages, an additional parallel path is provided through R3. The values of resistors R2 and R3 and the voltage drops across the diodes D8 and D9 are selected to match the variable impedance characteristics across section G of the robber current circuit 18 to match the characteristics of fuse system illustrated in FIG. 1. Thus, for a fuse system with other characteristics, it is apparent that the values of these components R2 and R3, (and possibly D8 and D9) would be changed.

The circuitry of F(Neg) is substantially the same as section F(Pos) except that the direction of the diodes are reversed, and PNP transistors are substituted for the NPN transistors of F(Pos). The function of section F(Neg) is substantially the same as section F(Pos), except that F(Neg) operates on the negative half cycles, while section F(Pos) operates on the positive half cycles. Accordingly, the components of F(Neg) have been given letter and numerical designations similar to that of F(Pos), except an "a" suffix have been added to the designations of F(Neg).

Section G1(Pos) comprises four diodes D10, D11, D12 and D13 and a resistor R4 connected in series. The upper terminal of the diode D10 connects to the rectifying bridge junction 38, and the lower end of the resistor R4 connects to the line 44 to the lower end of the coil 10. A second resistor R5 is connected between the line 44 and a junction point between the diodes D12 and D13, while a third resistor R6 connects from the line 44 to a junction point between the diodes D11 and D12. The resistor R4 is of a relatively low value (i.e. 1 ohm). The second resistor R5 is of a higher value (i.e. 33 ohms), and the third resistor R6 is of a substantially higher value (i.e. 680 ohms).

The section G1(Neg) is similar to the second G1(Pos), except that the direction of the diodes are reversed. Accordingly, the components of section G1(Neg) have been given like numerical designations with an "a" suffix distinguishing those of G1(Neg).

Section G2(Pos) comprises a pair of transistors Q12 and Q13 connected in a darlington configuration. The emitter electrode 54 of the transistor Q13 is connected to the line 44, while the collector electrode 56 of the transistor Q13 is connected through a diode D14 to the line 52. The emitter electrode 58 of the transistor Q12 is connected to the base electrode 60 of the transistor Q13. The collector electrode 64 of the transistor Q12 is also connected through the diode D14 to the line 52. Also, the two collector electrodes 56 and 64 are connected through a zener diode Z4 and through a resistor R7 to the line 44. There is also a base-emitter shunt resistor R8 connected from the line 44 to the base electrode 60 of the transistor Q13.

The section G2(Neg) has components similarly arranged to the section G2(Pos). Accordingly, the components of section G2(Neg) have been given like numerical designations with a "a" suffix distinguishing those components of G2(Neg), and a detailed description is not included herein.

To describe the operation of the present invention, it should first be indicated that the entire apparatus can be housed in a small block with dimensions of approximately 8"×5"×1¼". The pickup coil 10, with its associated core is so arranged that it can be slipped around the electrical cable which is to be monitored and clamped in place. The display device 12 is selected to be of a size that it could be read from a moderate distance (e.g. 10 feet). If a smaller display is used, less power is required. Thus, it is a trade-off between readability and the need to limit circuit costs.

Let it be assumed that the apparatus of the present invention has been clamped onto a line, and that the line current is within normal operating limits. As indicated previously, the alternating line current will cause an alternating voltage to be imposed across the pickup coil 10. A very small portion of the current generated in the coil 10 flows across the primary winding of the transformer T1. The current generated in the secondary winding of the transformer T1 flows through the bridge rectifier 28 to slowly charge the capacitor C1. As indicated previously herein in the description of the reset circuit 14, about once every minute the charge on the capacitor C1 builds up to the extent that it will cause the zener diode Z1 to be conductive and thus cause the transistors Q1 through Q4 to be conductive and transmit a reset charge to the display device.

Figure 3:
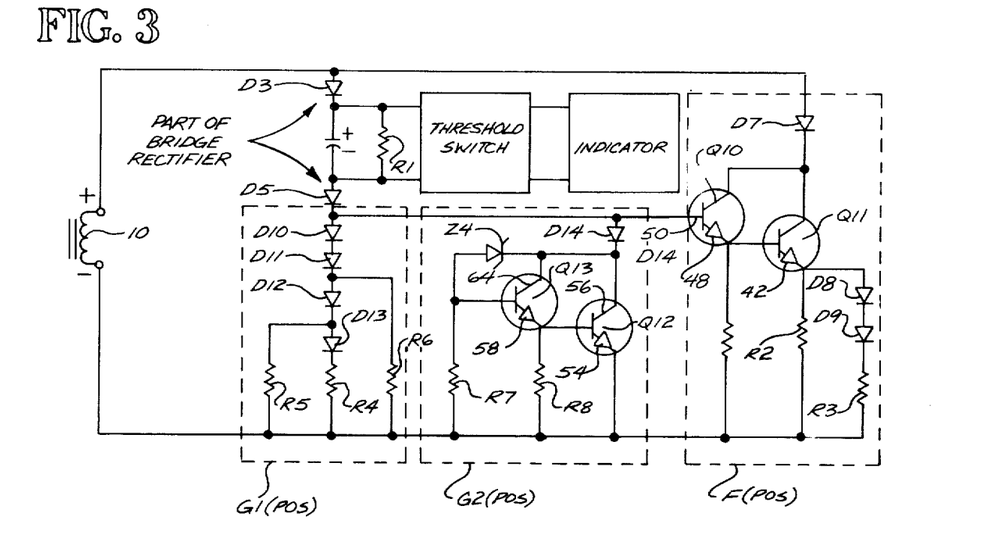
FIG. 3 is a simplified schematic of the circuitry of FIG. 2, showing only those components which function to indicate a fault on positive half cycles of the current being monitored.

To consider now the operation of the set circuit 16, let it be assumed that the coil 10 is on a positive half cycle so that the voltage at the terminal 20 is positive, while the voltage at the terminal 22 is negative. This can be best described with reference to FIG. 3, which shows only those components of the set circuit 16 and current robber circuit 18 which function on a positive half cycle to charge the capacitor C2. In FIG. 3, the zener diode Z2 and transistors Q6 and Q9 are indicated schematically as the "threshold switch". Also, only the two diodes D3 and D5 of the rectifying bridge 34 which conduct on the positive half cycle are shown in FIG. 3.

At normal line current levels, the voltage across the coil 10 is relatively small, and substantially all of the current will flow through the lower resistance path provided by section F(Pos). For current to flow through the path provided by the transistor Q3 and the resistor R2, the voltage across the pickup coil 10 need only be great enough to overcome the forward bias of the diode D3 and of the transistor Q3. At slightly higher line currents, the voltage across the coil 10 is moderately higher, so that it is able to overcome the forward bias of two more diodes D8 and D9 to provide a second parallel path and cause the impedance through section F(Pos) to be yet smaller. Thus, there will be little tendency to charge the capacitor C2.

Let it now be assumed that there is a moderate current surge in the low-fault range which causes a moderately higher voltage to be imposed across the coil 10. This voltage would be sufficient to overcome the forward bias of diodes D10 and D11 in section G1(Pos), thus causing current to flow through the high impedance path of resistor R6. In this situation, a moderate amount of current will flow through the bridge rectifier so that the capacitor C2 begins charging. If the current surge is of a sufficiently long duration, the charge on the capacitor C2 will build up to the extent where it reaches the threshold level and thus cause the transistors Q6 through Q9 to be conductive and transmit a fault signal to the display device. If the current surge is not of a sufficiently long duration, the charge on the capacitor C2 will simply dissipate over a period of time across the resistor R1.

Let it now be assumed that a yet higher current surge is experienced in the main line, so that a yet higher voltage is imposed across the coil 10. Under these circumstances, the voltage drop would be high enough to overcome the forward bias of an additional diode D12 in the section G1(Pos), so that there is yet another current path through the resistor R5 which has a substantially lower resistance value than the resistor R6. Thus, a substantially greater amount of current will flow through section G1(Pos) to charge the capacitor C2 at a yet higher rate. It should be understood that at the same time, current is flowing through the bypass route provided by section F(Pos). However, the components are so arranged that a greater proportion of the total current now flows through the path provided by section G1(Pos) than at lower voltage levels.

To proceed one step further, let it be assumed that the current surge in the main line is of a yet higher magnitude to cause a yet greater voltage drop across the coil 10. In this situation, the voltage is sufficiently high to overcome the forward bias of the diode D13 to cause a relatively low resistance path through the resistor R4. Thus, even a greater proportion of the total current (i.e. approximately half of the total current) flows through section G1(Pos) to cause the capacitor C2 to charge at a substantially higher rate.

Finally, for very high current surges, section G2(Pos) becomes conductive to produce a very low impedence path. The voltage level at which the transistors Q12 and Q13 begin to conduct is determined by the zener diode Z4, which is selected so that the current begins to flow through section G2(Pos) only after a voltage level has been reached higher than that at which resistor R4 begins to conduct. Also, by causing the section G2(Pos) to become conductive, protection for the other circuit components is provided.

Figure 4:
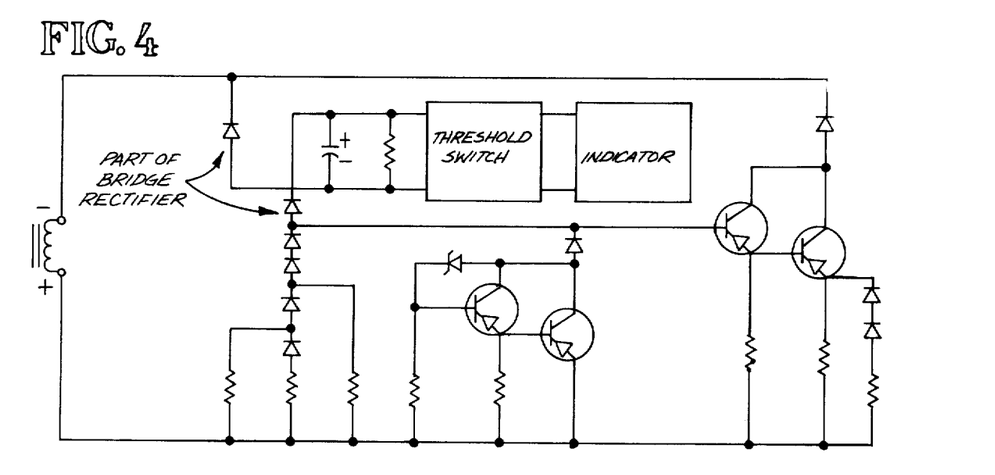
FIG. 4 is a simplified diagram similar to that of FIG. 3, showing only those components which operate to indicate a fault condition during negative half cycles of the current being monitored.

With regard to the operation of the apparatus on negative half cycles, reference is now made to FIG. 4. It is readily apparent from an examination of FIG. 4 that all of the main components are substantially identical to those of FIG. 3, except that the diodes are reversed and the NPN transistors have been replaced with PNP transistors. The mode of operation on the negative half cycle is substantially identical to that on the positive half cycle so a detailed description of the components of FIG. 4 will not be included herein.

From the foregoing description, it become quite apparent that for a given increase in the voltage imposed across the coil 10, there is a proportionately greater increase in the rate at which the capacitor C2 becomes charged. Thus, if we assume that the voltage imposed across the coil 10 is roughly proportional to the magnitude of the current surge, it becomes apparent that for a given increase in magnitude of the current surge, there is a correspondingly greater increase in the rate at which the capacitor C2 is charged. Since the capacitor C2 discharges when it reaches a certain threshold voltage, the time fault period becomes correspondingly shorter.

The advantages of the present invention can now be appreciated when the operation of the present invention is considered in conjunction with the characteristics of the fuse system illustrated in the graph of FIG. 1. As indicated previously, in terms of functional relationship for a given increase in current surge, the time-fault period decreases at a correspondingly greater rate. This relationship is such that the magnitude of the current to the capacitor C2 has an inverse functional relationship (specifically a logarithmic relationship) to the fault time period corresponding to the magnitude of the current surge being monitored. For example, as indicated previously, if the fault current level increases from 100 amperes to 1000 amperes, the fault time period decreases from 0.230 seconds to 0.005 seconds. The change of the fault current level is a tenfold increase, while the corresponding change in the fault time period is a reduction of one forty-sixth of the value at 100 amperes. Thus, the change of the fault current level is 10/46 of the absolute value of the rate of change of the fault time period.

If the robber current circuit 18 were not present, the capacitor C2 would charge at a rate which is generally directly proportional to the voltage drop across the coil 10. The addition of the robber current circuit 18 satisfies the functional requirement that the current to that capacitor C2 be inversely proportional to the fault time period corresponding to that magnitude of current surge.

It is to be understood that since the variable impedence paths in the robber current circuit 18 cause the overall impedence to change in incremental steps, these functional relationships are not mathematically precise. Rather these are a series of linear relationships which apply approximately to the system for relatively broad operating ranges. It is also to be understood that regardless of the accuracy or validity of the above functional relationships, it has been found that the apparatus of the present invention is able to reliably monitor fault and no fault conditions in an electrical cable. Thus, by properly selecting the components in the current robber circuit 18, the time within which the capacitor becomes charged to the threshold level can be timed to be moderately shorter than the time at which the fuse system FIG. 1 would interrupt the circuit for a given current surge, Thus, the apparatus of the present invention can be caused to reliably indicate a fault level shortly before the current interruption occurs in the main cable being monitored.

Figure 5:
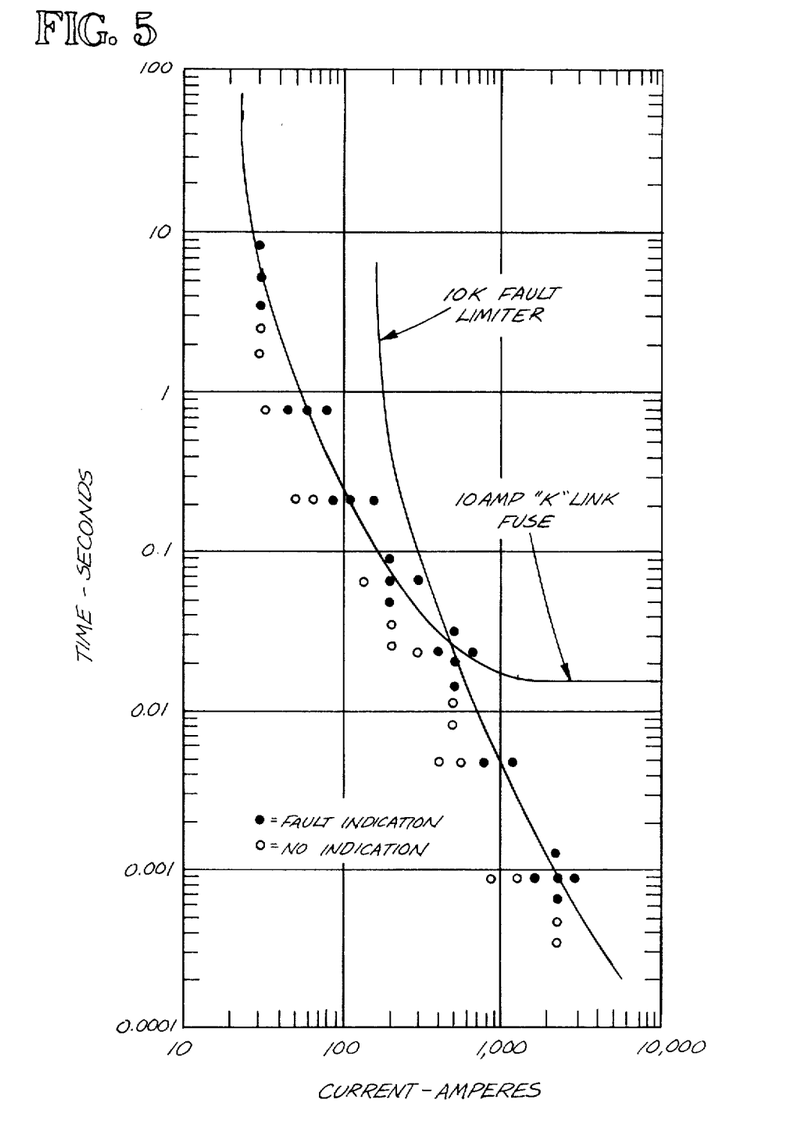
FIG. 5 is a graph such as shown in FIG. 1, showing test results in determining fault and no-fault conditions.

Reference is now made to FIG. 5, which illustrates the operation of a prototype made according to the present invention. This prototype was tested by clamping the apparatus onto an electric cable and imposing current surges on the cable for varying lengths of time. The black dots on the graph of FIG. 5 indicate those current surges (in terms of length of time of the surge and current intensity) which cause the apparatus to move to a fault indicating position. The white circles illustrate those current surges of a duration of time which did not cause the apparatus to indicate a fault condition. It can be seen that the performance characteristics of the present invention followed rather closely the actual characteristics of the fuse system for which the present invention was specifically designed to operate.

As indicated previously herein, the present invention can easily be adapted to be used in conjunction with the various fuse systems. This can be accomplished simply by changing the impedance values of the various components to match more closely the characteristics of the fuse system. Since the manner in which this can be done is readily apparent to those skilled in the art, this will not be described herein in detail.

What is claimed is:

1. A fault detecting apparatus adapted to detect in an electric cable a fault causing current surge at a fault level which is dependent upon both magnitude and duration of the current surge, said apparatus to be reliably responsive to a fault condition and nonresponsive to a no-fault condition, where said fault causing current surge is characterized in that for each fault current level above a minimum fault level, there is a corresponding fault time period within which a fault will occur, and magnitude of the fault current has an inverse functional relationship with magnitude of fault time period, in that for a given increase in magnitude of fault current level, there is a decrease in fault time period, said apparatus comprising:

a. a current sensing means adapted to be responsive to a current being monitored to produce a first signal having a value which varies as a function of magnitude of the current being monitored.

b. circuit means operatively connected to said current sensing means to be responsive to said first signal and produce a second signal of a value which has an inverse functional relationship to the fault-time period corresponding to the magnitude of the current being monitored, c. integrating means to integrate said second signal as a function of time to produce a fault signal where an integrated value produced by said integrating means is above a predetermined value, d. indicating means operatively connected to said integrating means to indicate a fault condition in response to said fault signal.

2. The apparatus as recited in claim 1, wherein said integrating means comprises capacitor means.

3. The apparatus as recited in claim 1, said circuit means further comprising variable impedance means operatively connected to said current sensing means and said capacitor means, said variable impedance means being responsive to said first signal to have impedance thereof varying as a function of magnitude of the first signal.

4. The apparatus as recited in claim 3, wherein said current sensing means comprises inductance coil means adapted to be positioned in proximity to the current being monitored, with voltage induced in said inductance coil means being the first signal, said first signal having a generally proportional relationship with the current surges in the current being monitored, in that increases in magnitude of current surges cause corresponding increases in the first signal, and said variable impedance means is responsive to the first signal to have its impedance thereof varying as a function of the magnitude of the current being monitored with respect to corresponding changes in the fault time period.

5. The apparatus as recited in claim 4, wherein for a change of the fault current level their is a relatively greater change of the corresponding fault time period, said variable impedance means having the impedance thereof decrease as a function of increases of fault current level.

6. The apparatus as recited in claim 4, wherein said circuit means comprises a first shunting circuit portion connected to said inductance coil in a manner to provide a shunting current path bypassing said capacitor means, said circuit means having a second charging circuit portion connected in series between said inductance coil means and said capacitor means in a manner to transmit the charging current to the capacitor means, said second charging circuit portion incorporating said variable impedance means said variable impedance means being responsive to said first signal in a manner to have the impedance thereof decrease as a function of increase in the first signal.

7. The apparatus as recited in claim 6, wherein said variable impedance means comprises a plurality of resistors connected in parallel with one another between said capacitor means and said inductance coil means, at least one of said resistors having a higher resistance level and connected in series with first diode means having a lower transmitting voltage difference value, and at least one other of said resistors having a lower resistance value and being connected in series with second diode means having a higher voltage difference transmitting value.

8. The apparatus as recited in claim 6, wherein said variable impedance means comprises a plurality of diodes connected in series with one another between said capacitor means and said inductance coil means, said variable impedance means further comprising a plurality of resistors connected in parallel with one another, at least one of said resistors having a lower resistance value and being connected in series with all of said diode means, at least one other resistor having a higher resistance value and being connected in parallel with at least one of said diode means and in series with at least one other of said diode means.

9. The apparatus as recited in claim 6, wherein said variable impedance means comprises at least three diodes connected in series with one another and three resistors connected in parallel with one another, namely a first resistor of relatively low resistance value being connected in series with said three diodes, a second resistor of intermediate resistance value being connected in series with two of said diodes and in parallel with a third of said diodes, and a third resistor of higher resistance value being connected in parallel with at least two of said diodes and in series with one of said diodes.

10. The apparatus as recited in claim 4, wherein said variable impedance comprises a plurality of resistors connected in parallel with one another between said capacitor means and said inductance coil means, at least one of said resistors having a higher resistance level and connected in series with first diode means having a lower transmitting voltage difference value, and at least one other of said transistors having a lower resistance value and being connected in series with second diode means having a higher voltage difference transmitting value.

11. The apparatus as recited in claim 4, wherein said variable impedance means comprises a plurlity of diodes connected in series with one another between said capacitor means and said inductance coil means, said variable impedance means further comprising a plurality of resistors connected in parallel with one another, at least one of said resistors having a lower resistance value and being connected in series with all of said diode means, at least one other resistor having a higher resistance value and being connected in parallel with at least one of said diode means and in series with at least one other of said diode means.

12. The apparatus as recited in claim 4, wherein said variable impedance means comprises at least three diodes connected in series with one another and three resistors connected in parallel with one another, namely a first resistor of relatively low resistance value being connected in series with said three diodes, a second resistor of intermediate resistance value being connected in series with two of said diodes and in parallel with a third of said diodes, and a third resistor of higher resistance value being connected in parallel with at least two of said diodes and in series with one of said diodes.

13. A fault detecting apparatus adapted to detect in an electric cable a fault causing current surge at a fault level which is dependent upon both magnitude and duration of the current surge, said fault detector to be reliably responsive to a fault condition and nonresponsive to a no-fault condition, said apparatus comprising:

a. a pickup coil adapted to be positioned in proximity to a current being monitored, in a manner that an indicating voltage signal is created by said current in said coil, b. a capacitor operatively connected to said pickup coil so as to be charged to a predetermined activating voltage level by the pickup coil, c. rectifying means operatively connected between said pickup coil and said capacitor d. switch means operatively connected to said capacitor so as to become operative at the activating level of the capacitor, e. an indicator operatively connected to the switch means so as to indicate a fault condition in response to operation of the switch means, f. a variable impedance circuit operatively connected between the pickup coil and the capacitor, said variable impedance circuit being responsive to the indicating signal in a manner that at higher voltage levels of the indicating signal, said circuit provides a lower impedance path from the coil to the capacitor, and at lower voltage levels, there is a higher impedance path between the coil and the capacitor.

14. The apparatus as recited in claim 13 wherein said variable impedance circuit comprises a plurality of resistors connected in parallel with one another between said capacitor and said coil, at least one of said resistors having a higher resistance level and connected in series with first diode means having a lower transmitting voltage difference value, and at least one other of said resistors having a lower resistance value and being connected in series with second diode means having a higher voltage difference transmitting value.

15. The apparatus as recited in claim 13 wherein said variable impedance circuit comprises a plurality of diodes connected in series with one another between said capacitor and said coil, said variable impedance means further comprising a plurality of resistors connected in parallel with one another, at least one of said resistors having a lower resistance value and being connected in series with all of said diode means, at least one other resistor having a higher resistance value and being connected in parallel with at least one of said diode means and in series with at least one other of said diode means.

16. The apparatus as recited in claim 13 wherein said variable impedance circuit comprises at least three diodes connected in series with one another and three resistors connected in parallel with one another, namely a first resistor of relatively low resistance value being connected in series with said three diodes, a second resistor of intermediate resistance value being connected in series with two of said diodes and in parallel with a third of said diodes, and a third resistor of higher resistance value being connected in parallel with at least two of said diodes and in series with one of said diodes.

17. The apparatus as recited in claim 16 wherein there is at least one transistor connected in parallel with said resistors, said transistor having a main current carrying electrode connected to a zener diode having a breakdown voltage higher than a voltage difference transmitting value of the three diodes of the variable impedance circuit, so that said transistor becomes conductive at indicating signal voltages higher than those at which said three diodes would become conductive.

18. The apparatus as recited in claim 14 wherein there is a transistor connected in parallel with said resistors, said transistor having a main current carrying electrode connected to a zener diode having a breakdown voltage higher than the voltage difference transmitting value of said second diode means 19. The apparatus as recited in claim 13 wherein said circuit comprises a first shunting circuit portion connected to the coil in a manner to provide a shunting path bypassing the capacitor, said circuit having a second charging circuit portion connected in series between the coil and the rectifying means in a manner to transmit a charging current to the capacitor, said second circuit portion incorporating variable impedance means, said shunting circuit portion being arranged relative to said second charging portion that at lower indicating voltage levels, a relatively small portion of current from the coil travels through said second charging circuit portion, and at higher indicating voltage levels, a relatively larger portion of current flows through said second charging circuit portion.

20. The apparatus as recited in claim 19 wherein said first shunting portion comprises at least one transistor which is caused to be conductive by current created in said coil.

21. The apparatus as recited in claim 20 wherein said first circuit portion comprises a first resistor connected in series with main current carrying electrodes of the transistor of the first circuit portion, and a second resistor connected in series with diode means, said second resistor and the diode means being connected in parallel with the first resistor and in series with the main current carrying electrode of the transistor of the first circuit portion.

22. A fault detecting apparatus adapted to detect in an electric cable a fault causing current surge, said apparatus comprising:

a pickup coil adapted to be mounted proximite a current to be monitored so as to have a voltage created in said coil as an indicating signal b. an indicator having a no-fault position and a fault position c. a reset circuit comprising:
  1. first rectifying means operatively connected to the coil so as to draw a small portion of current from said coil,
  2. a reset capacitor connected to said rectifying means so as to receive direct current therefrom and be charged to a predetermined discharge level,
  3. switch means operatively connected to said capacitor so as to become operative at the activating level of the reset capacitor, and connected to the indicator in a manner that operation of the first switch means causes said indicator to be in a no-fault position, d. a set circuit comprising:
  1. second rectifying means operatively connected to said coil so as to draw current therefrom,
  2. a set capacitor operatively connected to said rectifying means so as to be charged to a predetermined activating voltage,
  3. second switch means operatively connected to the set capacitor so as to become operative at the activating level of the set capacitor and operatively connected to the indicator so as to cause said indicator to be in a fault position, e. a robber current circuit operatively connected to said coil and to said set capacitor, said robber current circuit comprising:
  1. a first shunting current portion connected to said coil in a manner to provide a shunting current path bypassing the set capacitor, 2. a second charging circuit portion connected in series between the coil and the set capacitor in a manner to transmit a charging current to the capacitor, said second charging current portion comprising variable impedance means responsive to said indicating signal in a manner to have impedance thereof decrease as a function of increase in the indicating signal.

23. The apparatus as recited in claim 22 wherein said variable impedance means comprises a plurality of resistors connected in parallel with one another between said capacitor and said coil, at least one of said resistors having a higher resistance level and connected in series with first diode means having a lower transmitting voltage difference value, and at least one other of said resistors having a lower resistance value and being connected in series with second diode means having a higher voltage difference transmitting value.

24. The apparatus as recited in claim 22 wherein said variable impedance means comprises a plurality of diodes connected in series with one another between said capacitor and said coil, said variable impedance means further comprising a plurality of resistors connected in parallel with one another, at least one of said resistors having a lower resistance value and being connected in series with all of said diode means, at least one other resistor having a higher resistance value and being connected in parallel with at least one of said diode means and in series with at least one other of said diode means.

25. The apparatus as recited in claim 22 wherein said variable impedance means comprises at least three diodes connected in series with one another and three resistors connected in parallel with one another, namely a first resistor of relatively low resistance value being connected in series with said three diodes, a second resistor of intermediate resistance value being connected in series with two of said diodes and in parallel with a third of said diodes, and a third resistor of higher resistance value being connected in parallel with at least two of said diodes and in series with one of said diodes.

26. The apparatus as recited in claim 25 wherein there is at least one transistor connected in parallel with said resistors, said transistor having a main current carrying electrode connected to a zener diode having a breakdown voltage higher than a voltage difference transmitting value of the three diodes of the variable impedance means, so that said transistor becomes conductive at indicating signal voltages higher than those at which said three diodes would become conductive.

27. The apparatus as recited in claim 23 wherein there is a transistor connected in parallel with said resistors, said transistor having a main current carrying electrode connected to a zener diode having a breakdown voltage higher than the voltage difference transmitting value of said second diode.

28. The apparatus as recited in claim 22 wherein said first shunting portion comprises at least one transistor which is caused to be conductive by current created in said coil.

29. The apparatus as recited in claim 28 wherein said first circuit portion comprises a first resistor connected in series with main current carrying electrodes of the transistor of the first circuit portion, and a second resistor connected in series with diode means, said second resistor and the diode means being connected in parallel with the first resistor and in series with the main current carrying electrode of the transistor of the first circuit portion.

30. The apparatus as recited in claim 22 further comprising a resistor connected across said set capacitor to cause said set capacitor to discharge at a relatively slow rate.

31. A method of detecting in an electric cable a fault causing current surge at a fault level which is dependent upon both magnitude and duration of the current surge, in a manner to be reliably responsive to a fault condition and nonresponsive to a no-fault condition, where said fault causing current surge is characterized in that for each fault current level above a minimum fault level, there is a corresponding fault time period within which a fault will occur, and magnitude of the fault current has an inverse functional relationship with magnitude of fault time period, in that for a given increase in magnitude of fault current level, there is a decrease in fault time period, said method comprising:
    a. producing a first signal having a value which varies as a function of magnitude of the current being monitored
    b. producing a second signal in response to said first signal, with said second signal having a value which has an inverse functional relationship to the fault time period corresponding to the magnitude of the current being monitored,
    c. integrating said second signal as a function of time to produce a fault signal where an integrated value produced by integrating is above a predetermined value,
    d. transmitting said fault signal to an indicator to indicate a fault condition.

32. The method as recited in claim 31, said method further comprising directing a first signal through variable impedance means to a capacitor means, said variable impedance means being responsive to said first signal to have impedance thereof varying as a function of magnitude of the indicating signal.

33. The method as recited in claim 32, further comprising producing said first signal by inductance coil means adapted to be positioned in proximity to the current being monitored, with voltage induced in said inductance coil means being the first signal, said first signal having a generally proportional relationship with the current surges in the current being monitored, in that increases in magnitude of current surges cause corresponding increases in the first signal, and said variable impedance means is responsive to the first signal to have its impedance thereof varying as a function of the magnitude of the current being monitored.

34. The method as recited in claim 32, wherein current from said inductance coil is directed through a first shunting circuit portion connected to said inductance coil in a manner to provide a shunting current path bypassing said capacitor means, and through a second charging circuit portion connected in series between said inductance coil means and said capacitor means in a manner to transmit the charging current to the capacitor means, said method further comprising directing said second charging current portion through said variable impedance means, said variable impedance means being responsive to said first signal in a manner to have the impedance thereof decrease as a function of increase in the indicating signal.

35. The method as recited in claim 34, wherein said variable impedance means comprises a plurality of resistors connected in parallel with one another between said capacitor means and said inductance coil means, at least one of said resistors having a higher resistance level and connected in series with first diode means having a lower transmitting voltage difference value, and at least one other of said resistors having a lower resistance value and being connected in series with second diode means having a higher voltage difference transmitting value, said method further comprising directing charging current through said one resistor at lower values of the first signal, and directing said charging current also through said other transistor at higher values of the first signal.

36. The method as recited in claim 34, wherein said variable impedance means comprises a plurality of diodes connected in series with one another between said capacitor means and said inductance coil means, said variable impedance means further comprising a plurality of resistors connected in parallel with one another, at least one of said resistors having a lower resistance value and being connected in series with all of said diode means, at least one other resistor having a higher resistance value and being connected in parallel with at least one of said diode means and in series with at least one other of said diode means, said method further comprising directing charging current through said one resistor at lower values of the first signal, and directing said charging current also through said other transistor at higher values of the first signal.

37. The method as recited in claim 34, wherein said variable impedance means comprises at least three diodes connected in series with one another and three resistors connected in parallel with one another, namely a first resistor of relatively low resistance value being connected in series with said three diodes, a second resistor of intermediate resistance value being connected in series with two of said diodes and in parallel with a third of said diodes, and a third resistor of higher resistance value being connected in parallel with at least two of said diodes and in series with one of said diodes, said method further comprising transmitting current through said third resistor only at lower first signal values, transmitting charging current also through said second resistor at higher first signal values, and transmitting charging current also through said first resistor at yet higher first signal values.

38. A fault detecting apparatus adapted to detect in an electric cable a fault causing current surge at a fault level which is dependent upon both magnitude and duration of the current surge, said fault detector to be reliably responsive to a fault condition and nonresponsive to a no-fault condition, where said fault causing current surge is characterized in that for each fault current level above a minimum fault level, there is a corresponding fault time period within which a fault will occur, and magnitude of the fault current has an inverse functional relationship with magnitude of fault time period, in that for a given increase in magnitude of fault current level, there is a decrease in fault time period, said apparatus comprising:
  a. a current sensing means adapted to be responsive to a current being monitored to produce a first signal of a first value that has a direct proportional relationship to magnitude to the current being monitored,
  b. circuit means operatively connected to said current sensing means to be responsive to said first signal and produce a second signal of a second value that has a direct proportional relationship to a third value equal to the first value divided by a fourth value corresponding to magnitude of the current being monitored multiplied by the fault-time period corresponding to the magnitude of the current being monitored,
  c. integrating means to integrate said second signal as a function of time to produce a fault signal where an integrated value produced by said integrating means is above a predetermined value,
  d. indicating means operatively connected to said integrating means to indicate a fault condition in response to said fault signal.

* * * * *